United States Patent [19]

Jensen et al.

[11] Patent Number: 4,954,089
[45] Date of Patent: * Sep. 4, 1990

[54] TERMINATOR ASSEMBLY FOR INTERCONNECTING COMPUTER DEVICES

[75] Inventors: William T. Jensen, Mundelein; Vincent B. Brown, Prospect Heights; Cathy J. Edgerton, Barrington, all of Ill.; Robert W. Masterson, Denver, Colo.

[73] Assignee: Methode Electronics, Inc., Chicago, Ill.

[*] Notice: The portion of the term of this patent subsequent to Aug. 15, 2006 has been disclaimed.

[21] Appl. No.: 404,694

[22] Filed: Sep. 8, 1989

Related U.S. Application Data

[62] Division of Ser. No. 572,173, Jan. 18, 1984, Pat. No. 4,857,002.

[51] Int. Cl.$^5$ .................... H01R 9/09; H01R 13/66
[52] U.S. Cl. ........................... 439/76; 439/620; 338/307
[58] Field of Search ................. 338/307; 439/76, 620, 439/651

[56] References Cited

U.S. PATENT DOCUMENTS

| | | | |
|---|---|---|---|
| 3,551,874 | 12/1970 | Volinskie | 439/63 |
| 3,775,725 | 11/1973 | Endo | 338/262 |
| 3,964,087 | 6/1976 | Mallon | 338/306 |
| 3,965,330 | 6/1976 | Williams | 219/216 |
| 3,990,768 | 11/1976 | Faber | 439/651 |
| 4,030,792 | 6/1977 | Fuerst | 439/65 |
| 4,156,533 | 5/1979 | Ammon et al. | 277/229 |
| 4,239,319 | 12/1980 | Gladd et al. | 439/651 |
| 4,331,949 | 5/1982 | Kagawa | 338/307 |
| 4,386,820 | 6/1983 | Dola et al. | 439/651 |
| 4,420,877 | 12/1983 | McKenzie, Jr. | 29/739 |
| 4,500,160 | 2/1985 | Bertsch | 439/651 |
| 4,603,320 | 7/1986 | Farago | 439/65 |

Primary Examiner—Gary F. Paumen
Attorney, Agent, or Firm—Allegretti & Witcoff, Ltd.

[57] ABSTRACT

A compact terminator for interconnecting computer devices with each other and with peripheral equipment having contact ends to be interconnected with connectors. The contacts are interconnected on a circuit board employing thick film circuitry mounted thereon. The contacts are press fitted in plated through holes on the circuit board and form male or female connectors at one end. The device may be differential or single ended type.

6 Claims, 3 Drawing Sheets

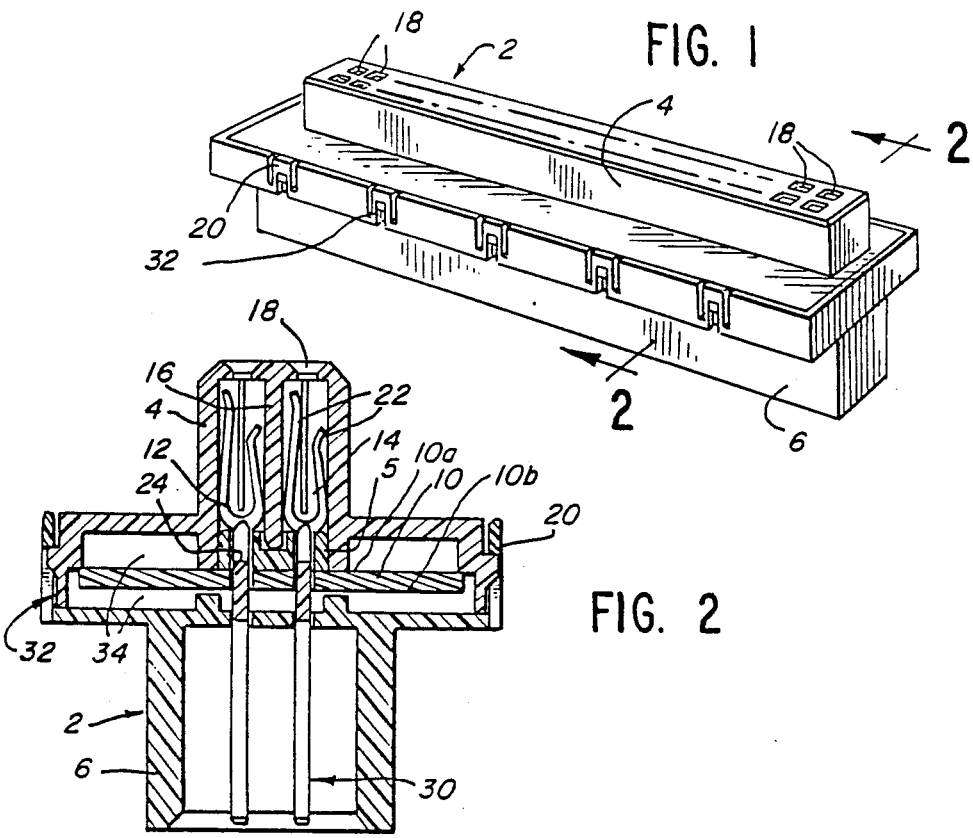
FIG. 1
FIG. 2
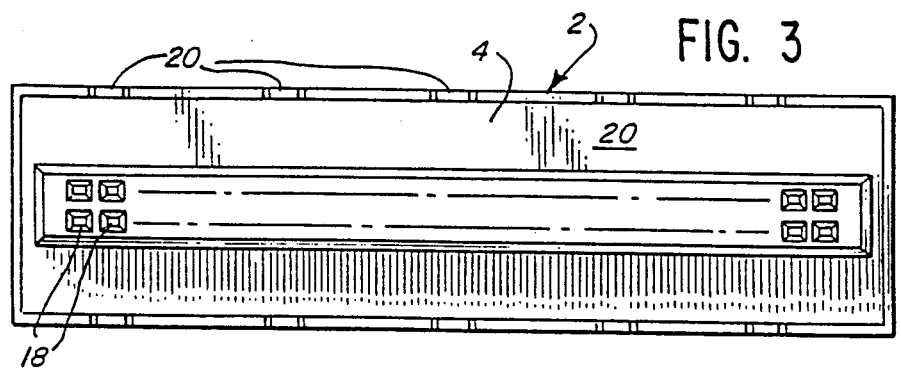
FIG. 3
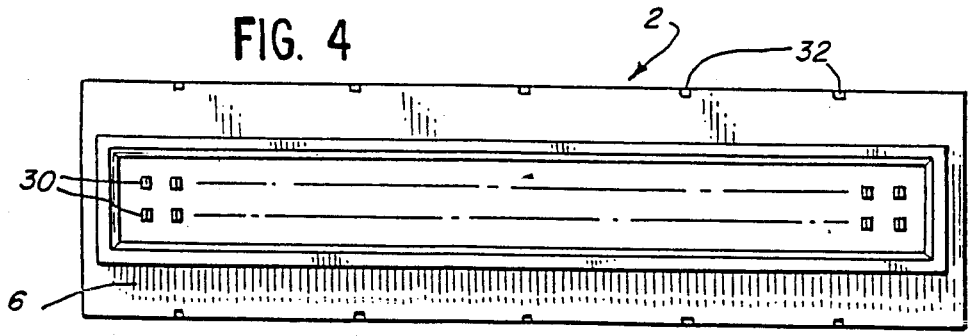
FIG. 4

TERMINATOR ASSEMBLY FOR INTERCONNECTING COMPUTER DEVICES

This is a division of application Ser. No. 572,173, filed Jan. 18, 1984, now Patent No. 4,857,002.

BACKGROUND OF THE INVENTION

This invention relates in general to computer systems and, in particular, to a device for interconnecting a host (source) computer with other (object) computers or peripheral equipment.

More specifically, this invention relates to a terminator for attaining compatibility between terminals, computers, printers and other equipment from different manufacturing sources.

The computer industry has introduced products from a multitude of different manufacturers involving many designs of disc drives, small computers, printers, terminals and related systems. Because of the presence of so many types of equipment, compatibility between systems from diverse sources has not been realized, with the result that many types of computers, peripheral equipment or software cannot be used with other products from another source.

Because code compatibility between diverse peripheral devices and computers does not exist, users have only been able to interconnect computers with peripheral equipment or other computers to a limited extent. The computer industry has failed heretofore to provide generally universal compatibility to enable the user of computer equipment to select and use products from a wide range of manufacturers. The failure to permit interchangeability of peripheral equipment with many types of computers, or computers with other computers, further makes the cost of software more expensive and less usable from machine to machine.

To solve this problem, numerous manufacturers and others in the computer industry set standards under the American National Standards Institute (ANSI) and developed specifications for effective information interchange. The circuits specified by ANSI provide code compatibility for use between a wide range of computers and with other computers or with peripheral equipment. Software programming becomes less expensive and its use can be shared by more systems than in previous equipment where compatibility could not exist.

SUMMARY OF THE INVENTION

It is therefore an object of the invention to attain compatibility between terminals, computers and related equipment.

Another object of this invention is to insure code compatibility between diverse peripheral devices.

A further object of this invention is to attain code compatibility through the use of an inexpensive and physically compact device.

Still another object of this invention is to provide a computer terminator for code compatibility employing in part thick film circuitry.

These and other objects are attained in accordance with the invention wherein there is provided a terminator assembly capable of meeting all applicable standards of the American National Standards Institute (ANSI). The device of the invention eliminates the use of discrete resistors with the result that a relatively bulky structural configuration is eliminated for superior results in use. The device of the invention employs thick film technology, such that electrical circuits are provided to permit a more universal interchange between computer devices.

DESCRIPTION OF THE DRAWINGS

Further objects of the invention, together with additional features contributing thereto and advantages accruing therefrom will be apparent from the following description of the preferred embodiments of the invention which are shown in the accompanying drawings with like reference numerals indicating corresponding parts throughout, wherein:

FIG. 1 is a front perspective view of an internal terminator of a differential type of the invention;

FIG. 2 is a sectional view taken along lines 2—2 of FIG. 1;

FIG. 3 is a top view of the terminator of FIG. 1;

FIG. 4 is a bottom schematic view of the terminator of FIG. 1;

DESCRIPTION OF THE PREFERRED EMBODIMENTS

Figure 5:
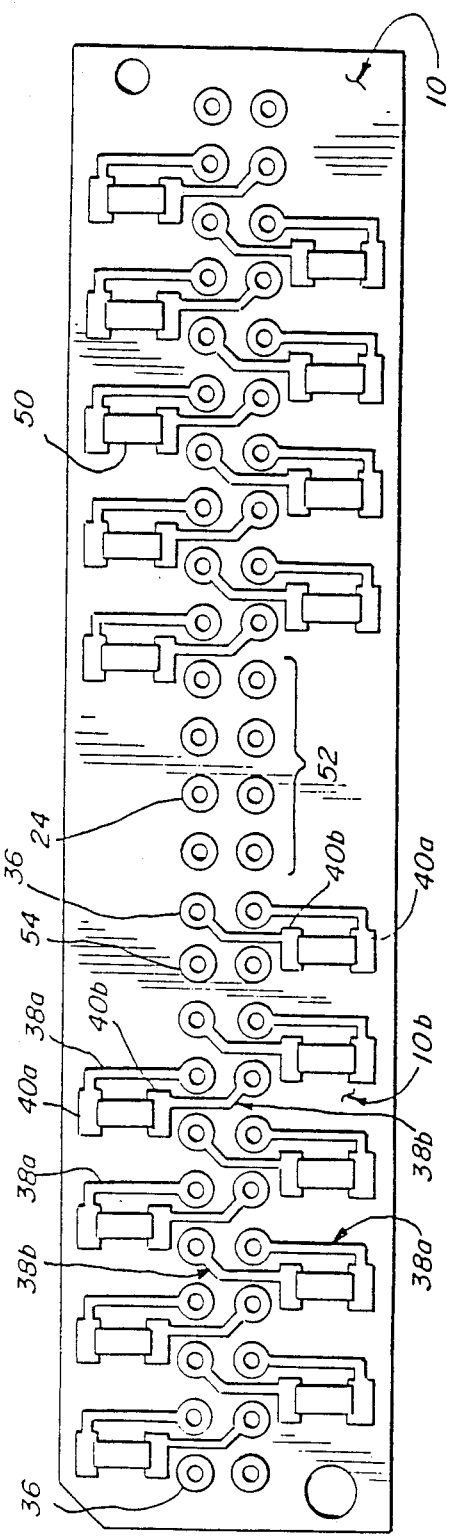
FIG. 5 is a top plan view of the PC board 10b for the terminator of a differential type.

Referring now to FIGS. 1-8, there are illustrated embodiments of the pluggable terminator of the invention for interconnecting small computers with each other and with low to medium performance, intelligent peripherals in the form of discs, either rigid or flexible, magnetic tape devices, printers, and the like. Although the invention is not intended to be so limited, the pluggable terminator described herein conforms to the specifications set forth in a draft proposed by American National Standard Institute under the development by a Task Group X3T9.2, including variations as specified by various computer manufacturers, as set forth in the publication entitled Small Computer System Interface, ANSC X3T9.2/82-2, Revision 6 (14 Feb., 1983).

The invention of the application is intended to be operated at rates up to approximately 4 megabytes per second and provides host computers with device independence. The invention may be used with disc drives, tape drive printers and communication devices of different types for interconnection with a host computer(s) without modifications of system hardware or software.

The terminator is designed to operate over distances of approximately 15 meters and data rates at 4 microbytes per second. Although the specific embodiments disclosed in FIGS. 1-8 conform to the standards for information interchange as specified by the American National Standards Institute, it is within the scope of the invention to modify the specifications or terminals in accordance with existing standards or design considerations.

The embodiment of the terminator described with reference to FIGS. 1-6 is directed to an internal terminator 2 of a differential form. Although the terminator 2 is shown having upper female contact ends and lower male ends, the invention is not intended to be so limited. The terminator of the invention may also employ all male pins on both connector sides of the terminator, all female contacts on both sides of the terminator, or male and female ends in opposite orientation than as shown in FIGS. 1–4.

The terminator of FIGS. 1–4 basically includes a female insulator 4, header 5, an insulative male shroud 6, a PC board 10 having thick film circuitry applied thereto, and a plurality of bifurcated contacts 12, although other contact forms can be used. In accordance with the ANSI specifications, fifty contacts 12 are arranged as pairs in two rows along the length of the terminator 2, as best seen in FIG. 3. Each pair of contacts 12 is disposed in compartments 14 within female insulator 4, such that each pair is separated by internal wall 16. The upper portion of the female insulator 4 is provided with openings 18 adjacent each contact to act as a guide to accept male pins. The pins of a device or cable assembly being inserted into the female openings 18 engage the contact ends 22 of contact 12. The female ends 22 can be formed as cantilevered, bifurcated portions of the contact. The contact ends 22 resiliently embrace the inserted pin to provide an electrical connection. The contacts 12 may be mounted on a header 5, PC board 10 and provide either male, female, or both contact interconnects in certain uses of the device.

The contacts 12 extend through holes 24 in the PC board 10 and provide male pins or tails 30 at the opposite side of the terminal from the female ends. The open ended male shroud 6 surrounds the tails 30 and is connected to the female header 5 by snap-on portions 32 that interfit with male shroud shoulder 20. The female insulator 4 and male shroud 6 form a compartment 34, in which the thick film resistor PC board 10 is positioned.

Figure 6:
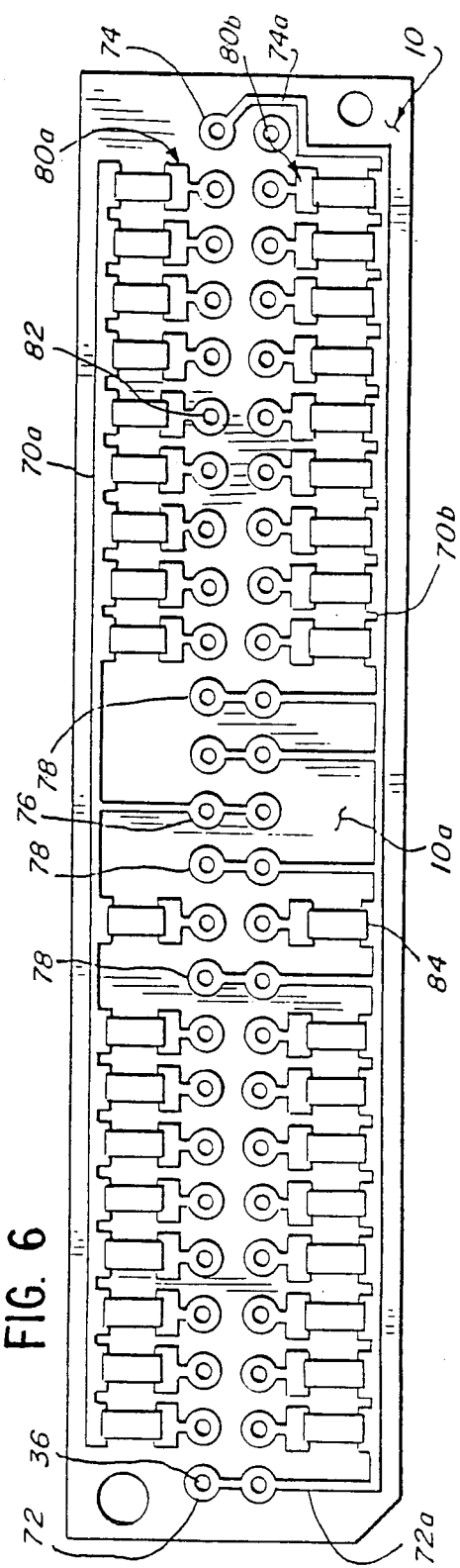
FIG. 6 is a plan view of the opposite side of the PC board 10a of the terminator of FIG. 5.

Referring to FIGS. 5 and 6, sides 1 and 2 of the PC board 10 are best illustrated and are respectively designated by reference numerals 10b, 10a. Side 10b of the PC board 10 is formed with fifty contact holes 24 extending through the board and forming fifty places provided with solder pads 36. The electrical circuit on both sides 10a and 10b is comprised of metal foils and-/or films to form conductive areas, and polymer compositions applied by a known thick film process to form resistive paths.

Thirty-six of the pads 36 are connected by a conductive trace 38a, 38b, to conductive outer and inner trace areas 40a, 40b. A thick film, screened resistor 50 is connected between each pair of conductive trace areas 40a, 40b, to form an electrical circuit therebetween with press fit section on lower portion of contacts 12. The resistors 50 are laid as a polymer composition on the PC board through the well-known thick film process, and the resistors 40 are formed from an appropriate polymer and the like. Each of the resistors on side 10b possesses a resistance of 150 ohms ±5%, and extend between adjacent trace areas 40a and 40b. As seen in FIG. 5, two pairs of end holes of pads 36 on side 10b are not connected to the resistors, as are four pairs 52 near the central portion of the PC board. Another central pair of pads 54 is also not connected to the resistors 50. In FIG. 5, eighteen resistors 50 are applied to side 10b.

In FIG. 6, side 10a of the PC board 10 is illustrated in which elongated conductive tracings 70a, 70b are also applied along opposed borders of the PC board 10. One end pair of solder pads 72 is electrically connected to the lower border tracing 70b by a conductive strip 72a, as is one of the opposite end pairs 74 by strip 74a. One central pair of the solder pads 76 is conductively connected to the upper conductive border tracing 70a. Three additional pairs 78 of solder pads in the central portion of the PC board are further connected by respective conductive tracings to the lower border 70b. Each of the remaining pairs of solder pads 82 are electrically connected by tracings to conductive trace areas 80a and 80b. A series of polymer resistors 84 applied as composition, extend between either of the border portions 70a, 70b, and a trace area 80a and 80b respectively. The resistors each have a resistance of 330 ohms ±5%, 1/16 watt. Side 10a of the PC board is likewise formed through a polymer thick film technology in a known manner to form the resistors for the circuit on both sides of the PC board. The use of thick film significantly reduces the size of the terminator in comparison to other techniques employing discrete resistors. On side 10a, 36 resistors are present.

The terminator 2 is in an eight-port, daisy chained bus which includes the following features. The terminator can be used with single and multiple host computer systems. The bus contention is handled by distributed arbitration on a prioritized basis, as required by ANSI standards. The terminator can accommodate multiple peripheral device types with asynchronous communication of up to 1.5 MBytes/sec., at 15 meters cable length and synchronous communication of up to 4 MBytes/sec. at 15 meters cable length. There can be multiple overlap of peripheral device operations and direct copy between peripheral devices, as outlined in the ANSC X3T9.2/82-2 specification.

The unit is oriented toward intelligent peripheral devices and communication of the buses is allowed only at two bus devices at any time. There is a maximum of eight bus devices and each port is attached to a bus device, e.g. peripheral device controller or host computer. The terminator of the invention is capable of conforming to ANSI specifications with a significantly smaller and less expensive unit as compared to the bulkier devices using discrete resistors, as outlined in the ANSC X3T9.2/82-2 specification.

Figure 7:
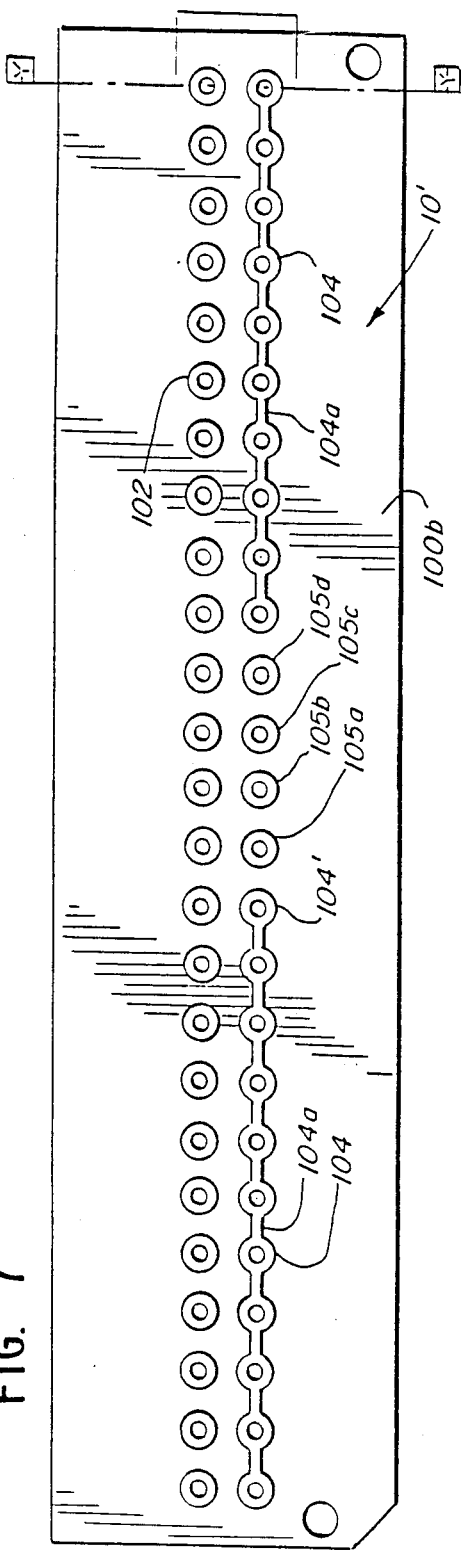
FIG. 7 is a plan view of the PC board for the terminator of a single ended type.
Figure 8:
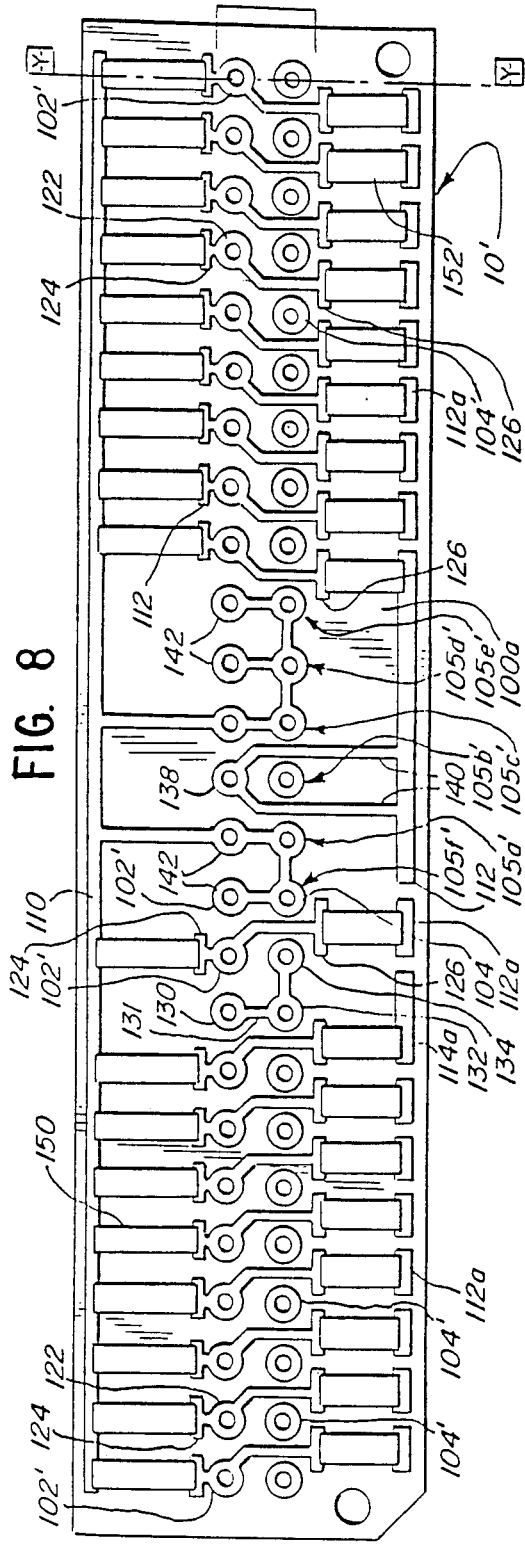
FIG. 8 is a plan view of the opposite side of the PC board of the terminator of FIG. 7.

Referring now to FIGS. 7 and 8, there is illustrated another embodiment of the terminator of the invention of a single ended type. The embodiment of FIG. 2 is an internal terminator and may be provided with a shroud, housing and contacts of a similar design as described with reference to FIGS. 1–6. It should be noted, however, that other contacts, regardless of whether male or female ends, may be interchangeably used, dependent on desired results.

The PC board 10' of the embodiment of FIGS. 7 and 8 is identical to that described with reference to the preceding embodiment and includes fifty holes for receiving the contacts (not shown) and arranged in two rows as pairs in the manner as the previous embodiment. Sides 100a and 100b of the PC board 10' include an electrical circuit also formed using a thick film technique. The holes in the PC board on both sides are surrounded with conductive solder pads on both sides. In FIG. 7, one row 102 of solder pads and contacts are not interconnected. The adjacent row 104 of solder pads is connected by conductive tracings 104a from each end with the exception of central solder pads 105 comprising pads 105a, 105b, 105c and 105d.

On opposite side 100a of the PC board, which is a view through side 100b, a conductive tracking strip 110 is applied as an elongated strip at one border portion. A second elongated strip 112 is applied at the opposite lower border portion. The border strip 112 is formed at its end portions as a plurality of separated, non-connected sections 112a of equal length except for section 114a.

Nine solder pads 122 in row 102' from each end of the PC board are conductively connected to conductive tracings 124 and 126 positioned on opposite sides. The corresponding solder pads 122 in row 104' do not form a circuit with the conductive areas 124 and 126. One pair of solder pads 130, 132 in rows 102, 104 are connected by a conductive trace 131 and, in turn, to an adjacent solder pad 134 in row 104'. Pads 130, 132 and 134 are connected by conductive trace 131. Pads 105a' and 105c' on side 100a, which correspond to the holes of pads 105a and 105c on side 100b, are electrically connected to an adjacent pad in row 102' by a tracing to continuous border tracing 110. The solder pad 138 adjacent to solder pad 105b' in row 102' is coupled by a pair of tracings 140 to the central portion of broken border tracing 112. The remaining 105d', 105e' and 105f' are electrically connected to their adjacent pairs 142 in row 102'.

Electrical resistors 150 formed from a polymer and applied by thick film printing technique form an electrical circuit connection between trace areas 124 and the continuous border tracing 110. Similarly, resistors 152 extend between the trace areas 126 and a respective portion 112a of strip 112. The resistors 150 possess a 330 ohm resistance, while resistors 152 are 220 ohms. Side 100a accordingly includes thirty-six resistors to form a terminator to interconnect computer devices in a manner to conform to ANSI specifications.

In the foregoing description, the invention of the application has been described with two internal terminators of a differential and single ended type. The principles of the invention can equally be used with external terminators of a single ended or differential type. Further, external and internal terminators constructed in accordance with the invention can include shielding means. An external terminator may be constructed in accordance with the invention by removal of male shroud 6 and contact ends 30.

While the invention has been described with reference to preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. In an assembly for providing code compatibility between a computer and peripheral devices, and including a housing for supporting a plurality of electrical contact members, said housing defining a plurality of openings at one end thereof to form a female receptacle, each of said electrical contact members having one end which is disposed within one of said openings to provide electrical contact with a male pin that is inserted into the respective opening, the improvement comprising, in combination:

a circuit board formed of insulative material and defining a plurality of holes therethrough;

an electrically conductive plating extending through said holes;

a resistor network carried by said circuit board, said resistor network comprising thick film polymer resistors connected to said conductive plating in a selected array;

said electrical contact members extending through said plated holes, whereby said housing, electrical contact members and said circuit board form a compact, unitary assembly;

said assembly also including a second male housing member which is connectable to said female receptacle to form an assembly comprising a female receptacle on one side of said circuit board and a male plug on the opposite side of said circuit board, said electrical contact members projecting through said plated holes in said circuit board and through corresponding openings in said second male housing member to form male pins at the side of said circuit board opposite from said female receptacle.

2. In an assembly as described in claim 1, said plurality of electrical contact members comprising 25 pairs of electrical contact members and said circuit board holes comprising 25 pairs of holes aligned with said 25 pairs of contact members.

3. In an assembly as described in claim 1 wherein said one end of said electrical contacts is bifurcated to receive an inserted male pin and provide electrical contact therewith.

4. In an assembly as described in claim 1 wherein said resistor network includes conductive tracings connected to said conductive plating and the polymer resistors are screen printed on the circuit board.

5. In an assembly as described in claim 1 where said second male housing member has a plurality of openings therein through which said electrical contact members pass after they pass through said holes in said circuit board, said openings in said male housing member being aligned with said holes in said circuit board and also with said openings in said female receptacle.

6. In an assembly as described in claim 1, said plurality of electrical contact members comprising 25 pairs of electrical contact members and said circuit board holes comprising 25 pairs of holes aligned with said 25 pairs of contact members, said housing and said second male housing member each having 25 pairs of openings aligned with said 25 pairs of contact members, said one ends of said electrical contacts each being bifurcated to receive an inserted respective said male pin and provide electrical contact therewith while the opposite ends of said contact members form said male pins at the opposite side of said circuit board, and said resistor network includes conductive tracings connected to said conductive plating and said polymer resistors are screen printed on said circuit board.

* * * * *